US007795885B2

(12) United States Patent
Gorczyca et al.

(10) Patent No.: US 7,795,885 B2
(45) Date of Patent: Sep. 14, 2010

(54) OPTICALLY ISOLATED CURRENT MONITORING FOR IONIZATION SYSTEMS

(75) Inventors: John A. Gorczyca, Lansdale, PA (US); King K. Miller, Philadelphia, PA (US)

(73) Assignee: Illinois Tool Works Inc., Glenview, IL (US)

( * ) Notice: Subject to any disclaimer, the term of this patent is extended or adjusted under 35 U.S.C. 154(b) by 818 days.

(21) Appl. No.: 11/682,762

(22) Filed: Mar. 6, 2007

(65) Prior Publication Data

US 2008/0218737 A1 Sep. 11, 2008

(51) Int. Cl.
*G01R 31/302* (2006.01)

(52) U.S. Cl. ...................................................... 324/750

(58) Field of Classification Search ................. 324/765, 324/750–753, 158.1, 464, 601, 414; 250/382, 250/379, 287, 423, 492.22; 361/231, 230
See application file for complete search history.

(56) References Cited

U.S. PATENT DOCUMENTS 4,061,961 A 12/1977 Baker
4,156,885 A 5/1979 Baker et al.
4,378,585 A 3/1983 Bete
4,410,934 A 10/1983 Fathauer et al.
5,124,905 A 6/1992 Kniepkamp
6,967,485 B1 * 11/2005 Hsueh et al. ................ 324/464
7,180,722 B2 * 2/2007 Jacobs et al. ................ 361/231

FOREIGN PATENT DOCUMENTS

EP 0 186 338 A2 2/1986
EP 0 554 882 A1 11/1993

OTHER PUBLICATIONS

PCT International Search Report and Written Opinion for PCT/US208/051746, Date of Mailing: Jun. 5, 2008, 12 pages.

* cited by examiner

*Primary Examiner*—Ha Tran T Nguyen
*Assistant Examiner*—Tung X. Nguyen
(74) *Attorney, Agent, or Firm*—Panitch Schwarze Belisario & Nadel LLP

(57) ABSTRACT

Current is measured in an ionization device that includes a high voltage supply, and an emitter electrically coupled to the HV supply. An opto-isolator is provided that includes a light source and a light detector. The light source has a current flowing through it. The light source is electrically coupled to the emitter. The output of the light detector is measured. The output of the light detector is related to the current flowing through the light source.

52 Claims, 8 Drawing Sheets

500

OPTICALLY ISOLATED CURRENT MONITORING FOR IONIZATION SYSTEMS

BACKGROUND OF THE INVENTION

Air ionization is an effective method of creating or eliminating static charges on non-conductive materials and isolated conductors. Air ionizers generate large quantities of positive and negative ions in the surrounding atmosphere which serve as mobile carriers of charge in the air. As ions flow through the air, they are attracted to oppositely charged particles and surfaces. Creation or neutralization of electrostatically charged surfaces can be rapidly achieved through this process.

Air ionization may be performed using electrical ionizers which generate ions in a process known as corona discharge. Electrical ionizers generate air ions through this process by intensifying an electric field around a sharp point until it overcomes the dielectric strength of the surrounding air. Negative corona occurs when electrons are flowing from the electrode into the surrounding air. Positive corona occurs as a result of the flow of electrons from the air molecules into the electrode.

Ionizer devices, such as an electrostatic charging system, an ionization system, or an alternating current (AC) or direct current (DC) charge neutralizing system, take many forms such as ionizing bars, air ionization blowers, air ionization nozzles, and the like, and are utilized to create or neutralize static electrical charge by emitting positive and negative ions into the workspace or onto the surface of an area. Ionizing bars are typically used in continuous web operations such as paper printing, polymeric sheet material, or plastic bag fabrication. Air ionization blower and nozzles are typically used in workspaces for assembling electronics equipment such as hard disk drives, integrated circuits, and the like, that are sensitive to electrostatic discharge (ESD). Electrostatic charging systems are typically used for pinning together paper products such as magazines or loose leaf paper.

Ionizers typically include at least one ionization emitter that is powered by a high voltage supply. The charge produced by the ionization emitter is proportional to the current flowing from the high voltage supply into the ionization emitter. Over time, an ionizer may accumulate debris. In order to maintain optimal the performance of the ionizer, it is necessary to clean the ionizer in order to remove the debris. As an ionizer accumulates debris, the ionizer's charge will decrease and, therefore, the current flowing from the voltage supply into the ionizer will also decrease. Conventionally, the current flowing from the voltage supply into the ionizer can be measured by using the return leg of the high voltage transformer or supply, but this allows only the sum current from the supply to be measured. It is difficult to monitor the current directly flowing into the ionization emitter because conventional current monitoring devices and circuits do not provide voltage isolation from the high voltage supply. Monitoring current is particularly difficult when multiple ionizers are connected in parallel to a single high voltage supply.

SUMMARY OF THE INVENTION

Current is measured in an ionization device that includes a high voltage supply, and an emitter electrically coupled to the HV supply. An opto-isolator is provided that includes a light source and a light detector. The light source has a current flowing through it. The light source is electrically coupled to the emitter. The output of the light detector is measured. The output of the light detector is related to the current flowing through the light source.

BRIEF DESCRIPTION OF THE DRAWINGS

The following drawings provide examples of the invention. However, the invention is not limited to the precise arrangements, instrumentalities, scales, and dimensions shown in these examples, which are provided mainly for illustration purposes only. In the drawings.

DETAILED DESCRIPTION OF THE INVENTION

Figure 1:
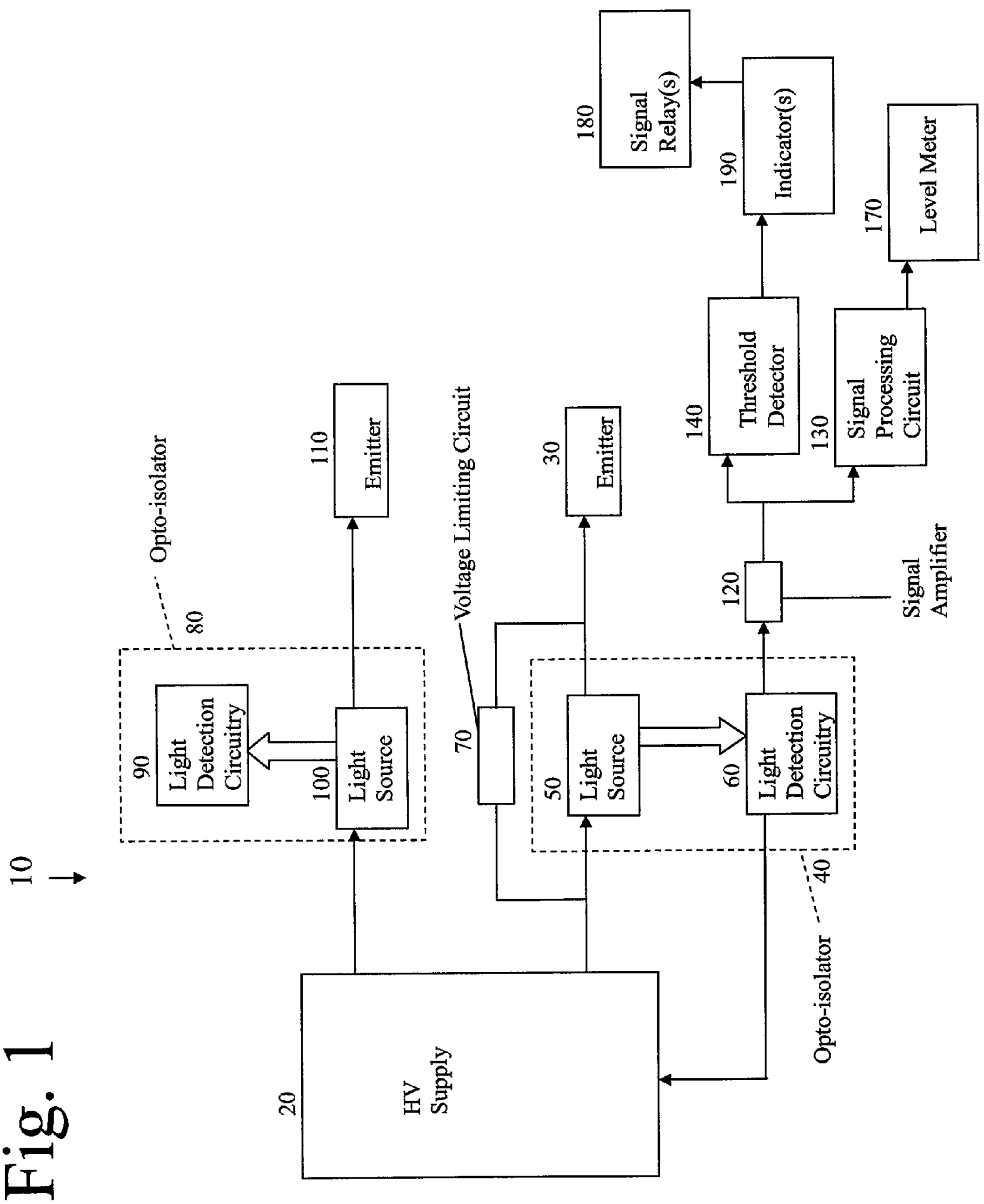
FIG. 1 is a schematic block diagram of an ionization device in accordance with a preferred embodiment of the present invention.

FIG. 1 shows an ionization device 10 according to one embodiment of the present invention. The ionization device 10 may be an electrostatic charging system, an ionization system, or an alternating current (AC) or direct current (DC) charge neutralizing system. The ionization device 10 includes a high voltage (HV) supply 20. The HV supply 20 may supply an AC or a DC voltage of about 3 kV to about 60 kV. The ionization device 10 further includes at least a first emitter 30. The first emitter 30 is electrically coupled to the HV supply 20 via and opto-isolator 40. The HV supply 20 supplies current to the first emitter 30. The current supplied to the emitter 30 is proportional to the voltage supplied by the HV supply 20, but is affected by the condition of the emitter and by atmospheric conditions, such as relative humidity. The ionization device 10 further includes a first opto-isolator 40. A current flowing from the HV supply 20 to the first emitter 30 flows through the opto-isolator 40.

The opto-isolator 40 includes a light source 50. The light source 50 may be an LED, a neon bulb, an incandescent bulb, an electroluminescent element or any other light source commonly known in the art. The light source 50 gives off light as an output that is proportional to the current flowing through the light source 50. A voltage limiting circuit 70 limits the voltage across the light source 50 of the opto-isolator 40. The ionization device 10 further includes light detection circuitry 60 that receives and measures the light output by light source 50 of the opto-isolator 40. The light detection circuitry (light detector) 60 may include a pin diode, a photo diode, a phototransistor, a resistive photocell, or any other light detecting element commonly known in the art. The light source 50 of the opto-isolator 40 is electrically isolated from the light detection circuitry 60. The light source 50 of the opto-isolator 40 is separated from the light detection circuitry 60 by an air gap, by potting material, by a fiber optic light pipe or by any other method of providing electrical isolation that is commonly known in the art. A signal amplifier 120 is electrically coupled to the light detector 60 in order to amplify the output of the light detector 60. Signal processing circuit 130 is electrically coupled to the light detector 60, through signal amplifier 120. The signal processing circuit 130 measures the output of the light detector 60. At least one threshold detector 140 is electrically coupled to the light detector 60 through the signal amplifier 120. The threshold detector(s) 140 detects whether the output of the light detector 60 exceeds or falls below at least one threshold, thereby detecting if the current flowing through the light source 50 exceeds or falls below at least one threshold. A level meter 170 is electrically coupled to the light detector 60 through the signal amplifier 120. The level meter 170 graphically or numerically displays a measurement of the output of the light detector, thereby displaying a measurement of the current flowing through the light source 50. The output(s) of the threshold detector(s) 140 are electrically connected to the input of an indicator 190. The indicator 190 displays a signal showing whether the output of the light detector 60 exceeds or falls below the threshold of the threshold detector 140. The output(s) of the threshold detector(s) 140 are electrically connected to the input(s) of a signal relay 180.

The light detection circuitry 60 is electrically coupled to the HV supply 20 in order to provide feedback to the HV supply 20 based upon the current flowing through the light source 50. The voltage supplied by the HV supply 20 is regulated in response to the feedback provided by the light detection circuitry 60, thereby regulating the current flowing to the emitter 30.

The ionization device 10 further includes at least one second emitter 110. The second emitter 110 is electrically coupled to the HV supply 20. The ionization device 10 further includes at least one second opto-isolator 80. The second opto-isolator 80 is electrically coupled to the HV supply 20. The second opto-isolator 80 is also electrically coupled to the second emitter 110. A current flowing from the HV supply 20 to the second emitter 110 flows through the second opto-isolator 80.

The second opto-isolator 80 includes a second light source 100. The second light source 100 may be an LED, a neon bulb, an incandescent bulb, an electroluminescent element or any other light source commonly known in the art. The second light source 100 gives off light as an output that is proportional to the current flowing through the second light source 100. The second opto-isolator 80 further includes a second light detection circuitry 90 that receives and measures the light output by second light source 100 of second opto-isolator 80. The second light detection circuitry 90 may include a pin diode, a photo diode, a phototransistor, a photocell, or any other light detecting element commonly known in the art. The second light source 100 is electrically isolated from the second light detection circuitry 90 by a spatial air gap, by potting material, by a fiber optic light pipe or by any other method of providing electrical isolation that is commonly known in the art. The measurements taken by the second light detection circuitry 90 of second opto-isolator 80 are independent of the measurements taken by the light detection circuitry 60 of the opto-isolator 40, which allows the performance of the emitters 30, 110 to be evaluated independently.

Figure 2:
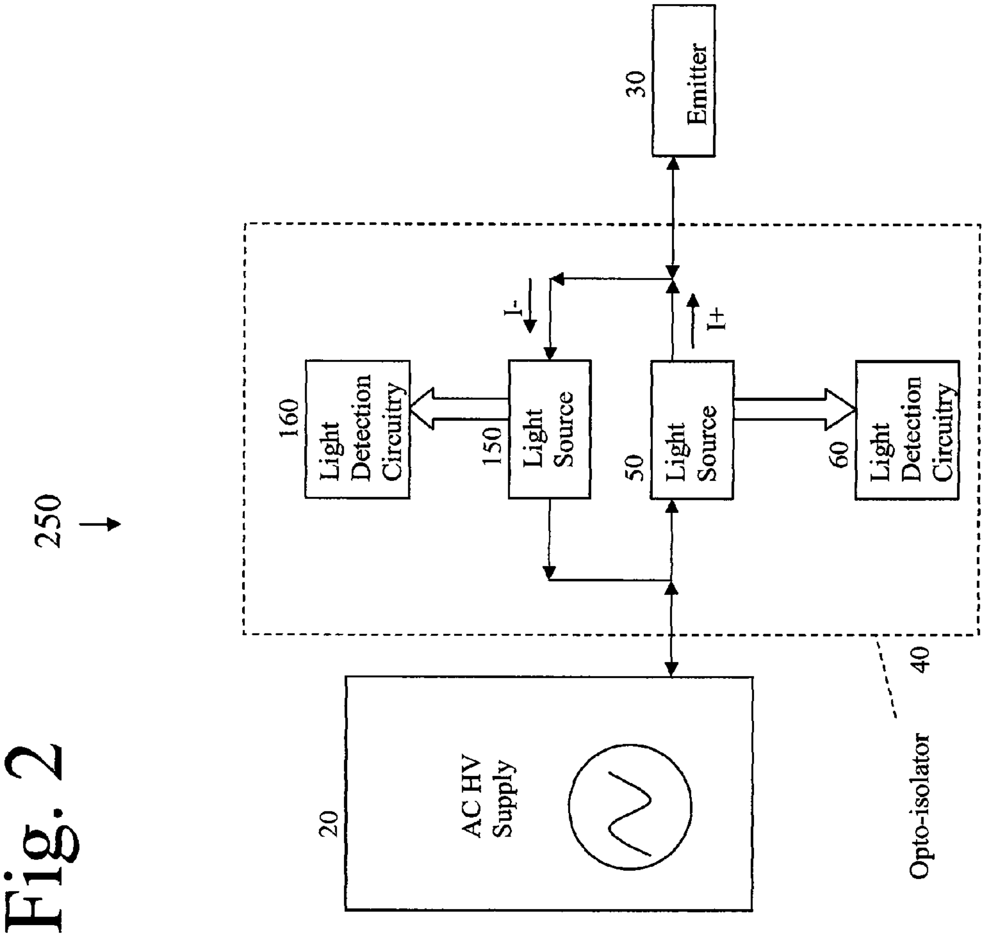
FIG. 2 is another schematic block diagram of an ionization device in accordance with a preferred embodiment of the present invention.

FIG. 2 shows an ionization device 250 according to another embodiment of the present invention. The HV supply 20 supplies an AC voltage which causes an AC current to flow through the opto-isolator 40. The opto-isolator 40 includes two light sources (a first light source 50 and a second light source 150) and two light detection circuits (a first light detection circuit 60 and a second light detection circuit 160). The first light source 50 gives off light only when the AC current flowing through the opto-isolator 40 is a positive current I+. The first light detection circuit 60 detects the light given off by the first light source 50. The second light source 60 gives off light only when the AC current flowing through the opto-isolator 40 is a negative current I−. The second light detection circuit 160 detects the light given off by the second light source 60. Thus, the opto-isolator is able to measure both the positive and negative flowing portions of the AC current flowing through the opto-isolator 40. The ionization device 250 according to this embodiment can further include additional emitters (not shown) which are connected in parallel to the HV supply 20 through additional opto-isolators (not shown), each additional opto-isolator having the same arrangement as the opto-isolator 40.

Figure 5:
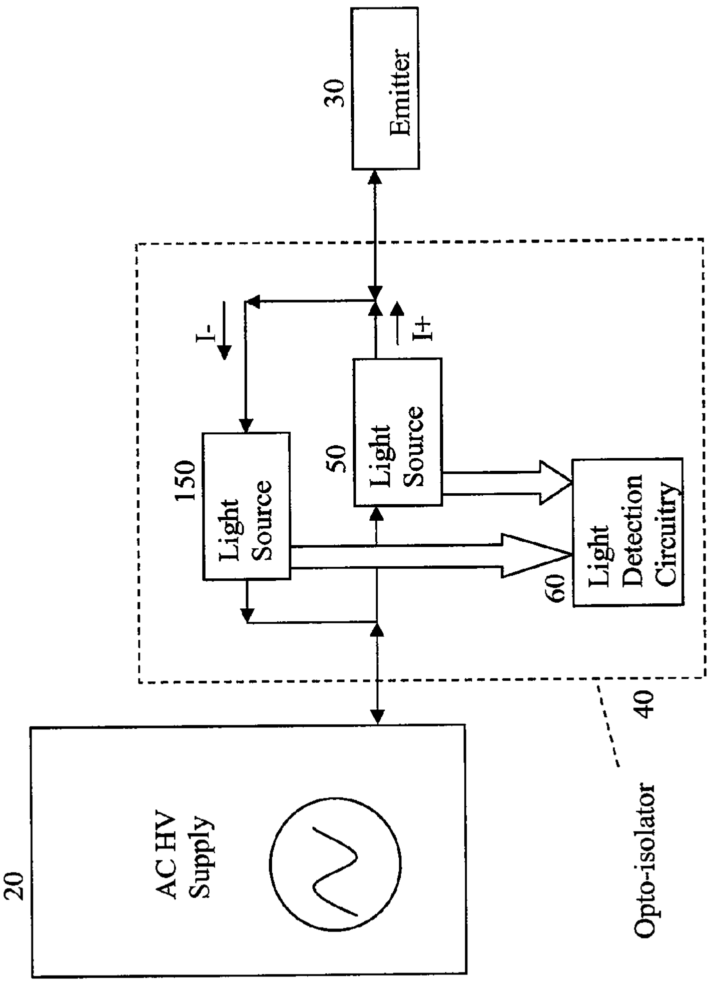
FIG. 5 is another schematic block diagram of an ionization device in accordance with a preferred embodiment of the present invention.

FIG. 5 shows an ionization device 500 according to another embodiment of the present invention. The HV supply 20 supplies an AC voltage which causes an AC current to flow through the opto-isolator 40. The opto-isolator 40 includes two light sources (a first light source 50 and a second light source 150) and one light detection circuit 60. The first light source 50 gives off light only when the AC current flowing through the opto-isolator 40 is a positive current I+. The second light source 60 gives off light only when the AC current flowing through the opto-isolator 40 is a negative current I−. The light detection circuit 60 detects the light given off by both the first light source 50 and second light source 60. Thus, the opto-isolator is able to measure the sum of the magnitudes of the positive and negative flowing portions of the AC current flowing through the opto-isolator 40. The ionization device 500 according to this embodiment can further include additional emitters (not shown) which are connected in parallel to the HV supply 20 through additional opto-isolators (not shown), each additional opto-isolator having the same arrangement as the opto-isolator 40.

Figure 3:
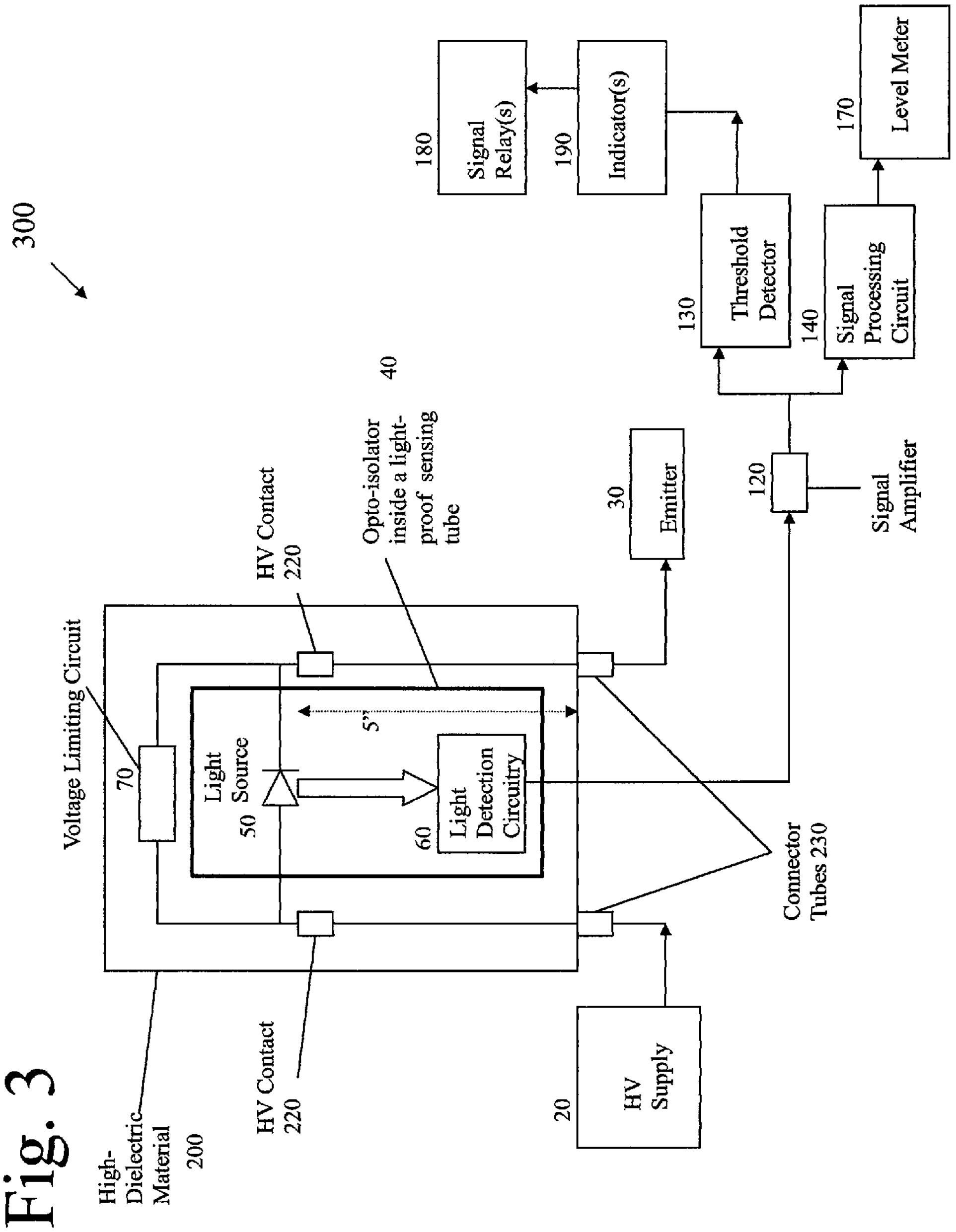
FIG. 3 is another schematic block diagram of one possible detailed implementation of an ionization device in accordance with a preferred embodiment of the present invention.

FIG. 3 shows one detailed implementation of an ionization device 300 in accordance with a preferred embodiment of the present invention. The opto-isolator 40 is enclosed inside a light proof sensing tube that allows the opto-isolator 40 to achieve about 60 kV of voltage isolation with a separation distance of about 5 inches. The light source 50 of the opto-isolator 40 is an LED with a wavelength of about 890 nm. The light detection circuit 60 is a phototransistor or a pin diode. A phototransistor is preferred because it requires less circuitry for signal processing. The light detection circuit 60 is selected to have a peak response at an 890 nm wavelength. Because the ionization device 10 operates at a high voltage, voltage limiting circuitry 70 is necessary to protect the LED 50 from over-biasing and excessive reverse voltages. Also because the ionization device 10 operates at a high voltage, the opto-isolator 40 and the voltage circuitry 70 are potted in a high dielectric material (HDM) 200, such as an acrylic block. The high dielectric material 200 provides isolated means for making high voltage electrical connections and, thus, prevents unwanted corona from damaging the construction. The HV supply 20 and the emitter 30 are connected to the light source 50 inside HDM 200 through connector tubes 230 attached to the outside of the HDM 200 and then through high voltage contacts 220 embedded within the HDM 200. Embedding the high voltage contacts 220 within the HDM 200 increases the safety of the device 300.

Figure 6:
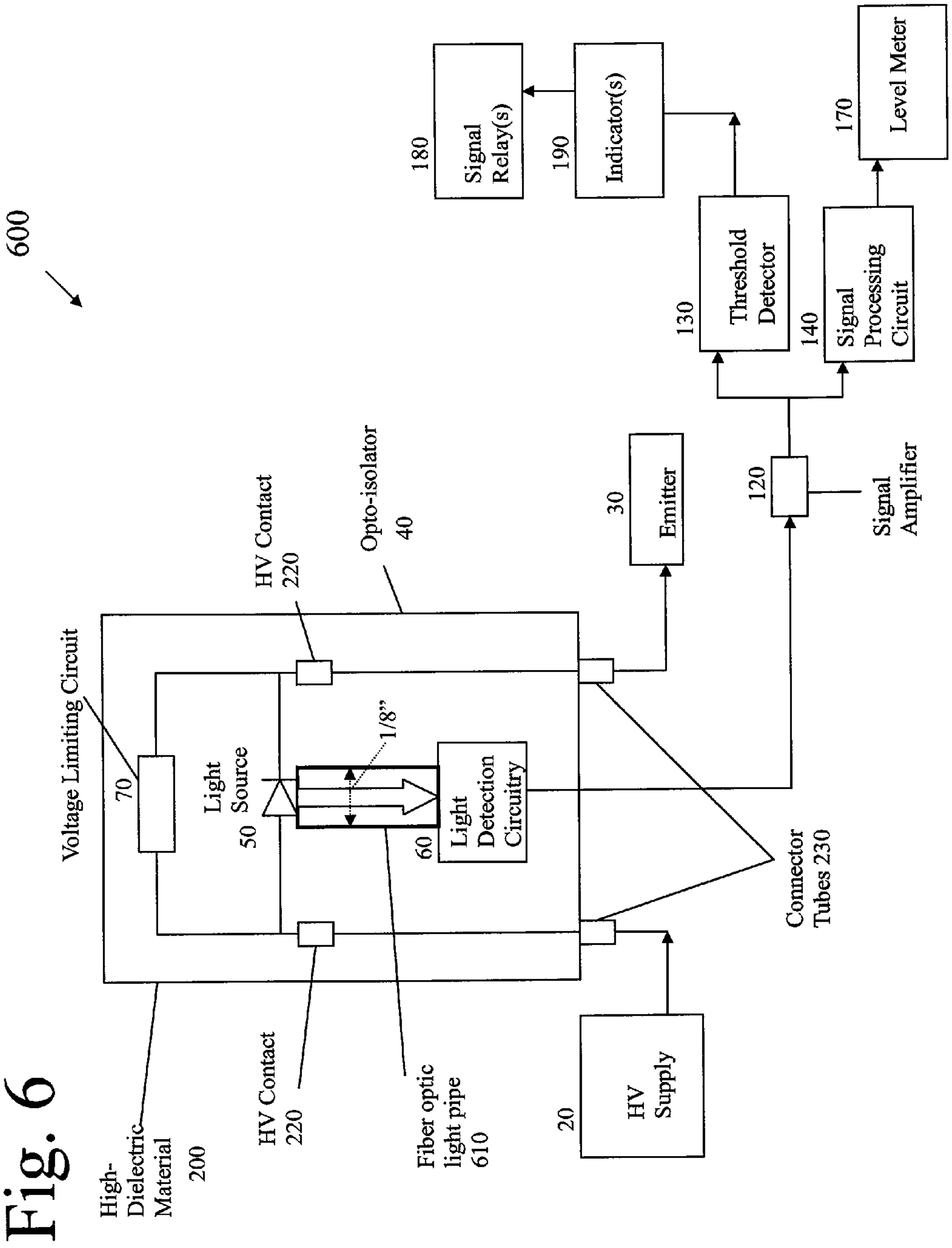
FIG. 6 is schematic block diagram of another possible detailed implementation of an ionization device in accordance with a preferred embodiment of the present invention.

FIG. 6 shows another detailed implementation of an ionization device 600 in accordance with a preferred embodiment of the present invention. The opto-isolator 40 includes a fiber optic light pipe 610. The fiber optic light pipe is preferably made of a high refractive index poly-carbonate material. The fiber optic light pipe 610 has a diameter of about ⅛ inch. The light given off by the light source 50 travels through the fiber optic light pipe to the light detection circuit 60. The light source 50 of the opto-isolator 40 is preferably an LED with a wavelength of about 890 nm. The light detection circuit 60 is preferably a phototransistor or a pin diode. A phototransistor is preferred because it requires less circuitry for signal processing. The light detection circuit 60 is selected to have a peak response at a wavelength of about 890 nm. Because the ionization device 10 operates at a high voltage, voltage limiting circuitry 70 is necessary to protect the LED 50 from over-biasing and excessive reverse voltages. Also, because the ionization device 10 operates at a high voltage, the opto-isolator 40, the fiber optic light pipe 610 and the voltage circuitry 70 are potted in a HDM 200, such as an acrylic block. The high dielectric material 200 provides isolated means for making high voltage electrical connections and, thus, prevents unwanted corona from damaging the construction. Because the light given off by the light source 50 travels through the light pipe 610, no air path is necessary, thereby increasing the isolation provided by the HDM 200. The HV supply 20 and the emitter 30 are connected to the light source 50 inside the HDM 200 through connector tubes 230 attached to the outside of the HDM 200 and then through high voltage contacts 220 embedded within the HDM 200. Embedding the high voltage contacts 220 within the HDM 200 increases the safety of the device 600.

Figure 4A:
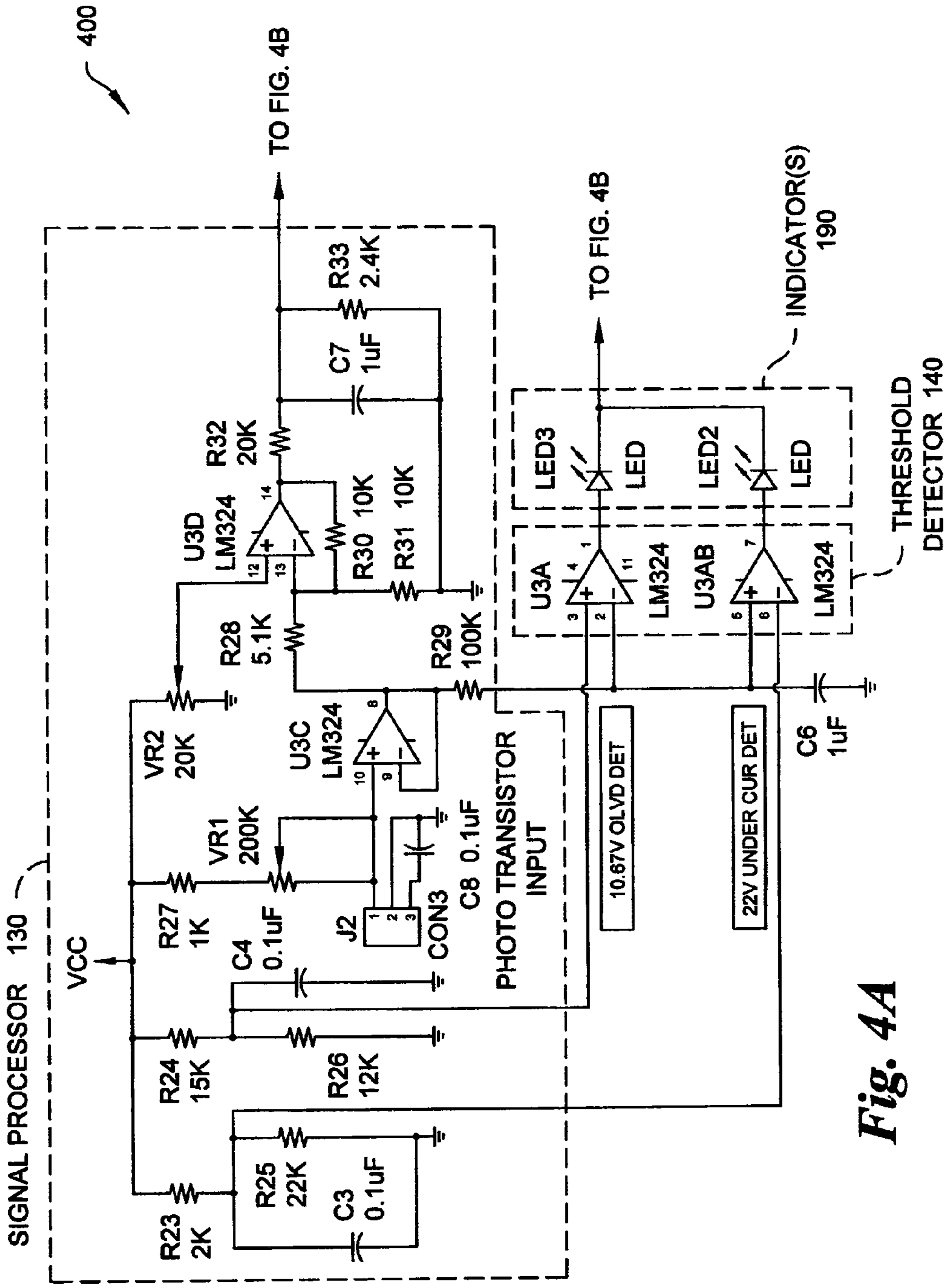
FIGS. 4A, 4B and 4C, taken together, show an electrical schematic diagram of one detailed implementation of an ionization device in accordance with a preferred embodiment of the present invention.
Figure 4B:
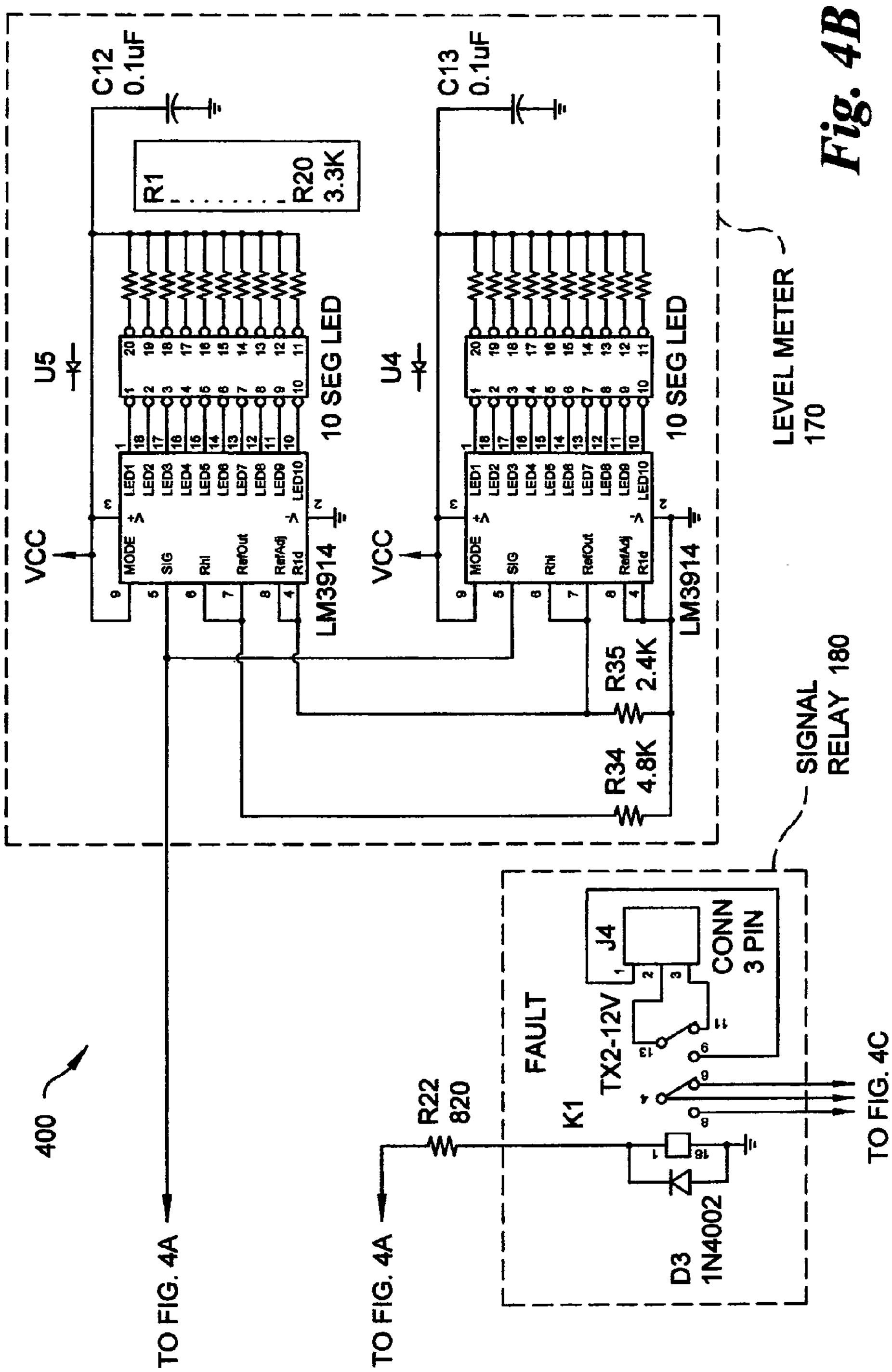
Figure 4C:
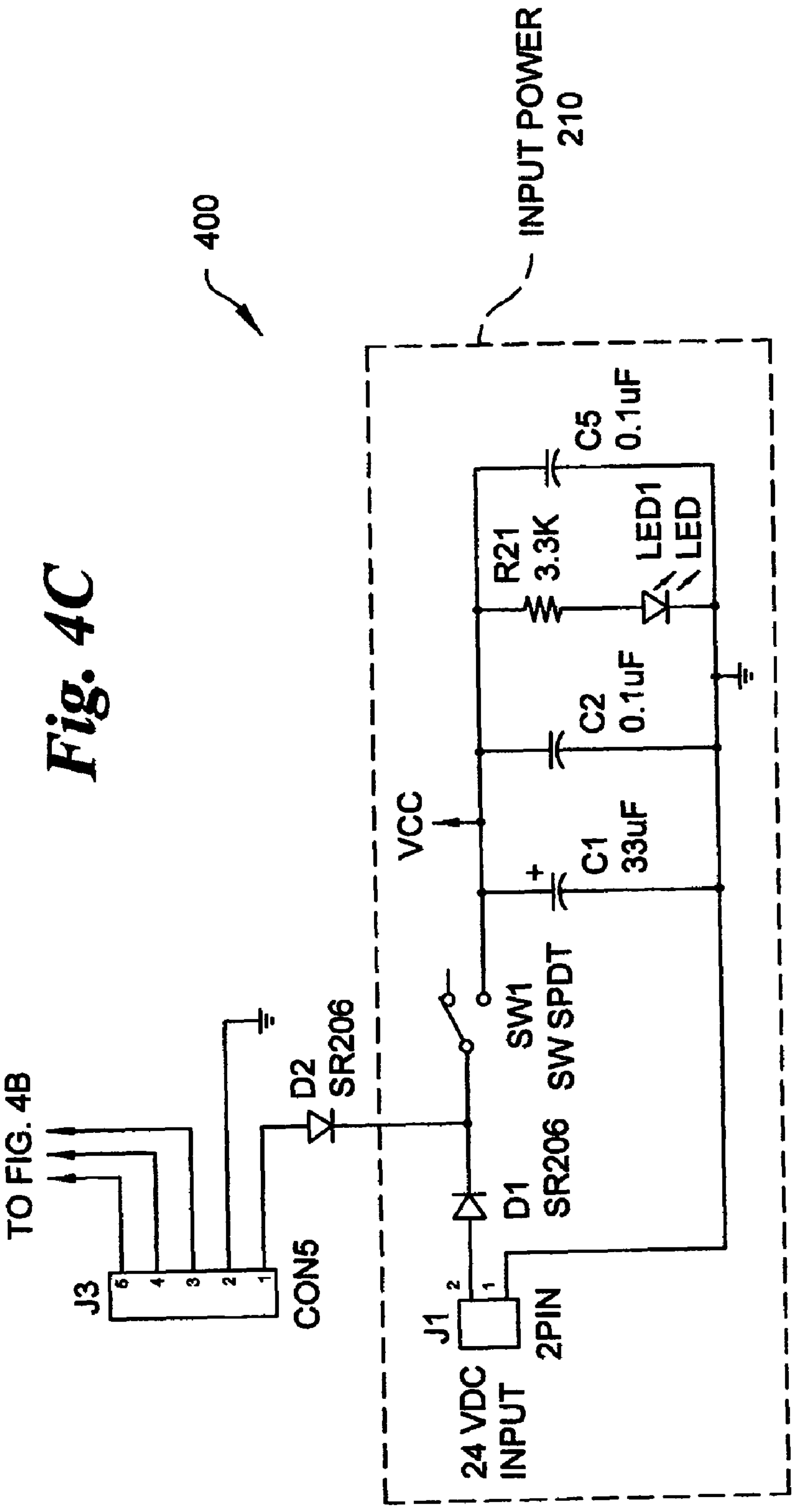

FIGS. 4A, 4B and 4C, taken together, show one detailed circuit implementation of a portion of an ionization device 400 in accordance with a preferred embodiment of the present invention. The output of the signal processor 130 is electrically connected to a level meter 170 such as a volt meter. One or more threshold detector(s) 140 are electrically coupled to the signal processor 130 in order to detect one or more threshold level(s) of current flowing through the light source 50 (see FIG. 1). The output(s) of the one or more threshold detector(s) 140 are electrically connected to indicator(s) 190. The output(s) of the one or more threshold detector(s) 140 are electrically connected to the input(s) of an output relay 180. The output of the output relay 180 is electrically connected to an input power supply 210.

It will be appreciated by those skilled in the art that changes could be made to the embodiments described above without departing from the broad inventive concept thereof. It is understood, therefore, that this invention is not limited to the particular examples disclosed, but it is intended to cover modifications within the spirit and scope of the present invention as defined by the appended claims.

What is claimed is:

1. A method of measuring current in an ionization device, the ionization device including (i) a high voltage supply, and (ii) an emitter electrically coupled to the HV supply, the method comprising:

(a) providing an opto-isolator including a light source and a light detector, the light source having a current flowing through it;

(b) electrically coupling the light source to the emitter; and (c) measuring the output of the light detector, the output of the light detector being related to the current flowing through the light source.

2. The method of claim 1, wherein the current flowing through the light source is the current flowing to the emitter.

3. The method of claim 1, wherein the current flowing through the light source is the current flowing from the HV supply.

4. The method of claim 1, wherein the light source is selected from the group comprising: an LED, a neon bulb, an incandescent bulb, and an electroluminescent element.

5. The method of claim 1, wherein the light detector is selected from the group comprising: a pin diode, a photo diode, a phototransistor, and a resistive photocell.

6. The method of claim 1, further comprising:

(d) providing a voltage limiting circuit that limits the voltage across the light source.

7. The method of claim 1, wherein the light detector and the light source are spatially separated by an air gap.

8. The method of claim 1 wherein the light source outputs light, the method further comprising:

(d) transmitting the light output from the light source to the light detector through a fiber optic light pipe.

9. The method of claim 1, wherein the light detector and the light source are electrically isolated by a potting material.

10. The method of claim 1, wherein the ionization device further includes (iii) a second emitter electrically coupled to the HV supply, the method further comprising:

(d) providing a second opto-isolator, including a light source and a light detector, the light source having a current flowing through it;

(e) electrically coupling the light source of the second opto-isolator to the second emitter; and (f) measuring the output of the light detector of the second opto-isolator, the output of the light detector of the second opto-isolator being related to the current flowing through the light source of the second opto-isolator.

11. The method of claim 1, further comprising:

(d) providing a signal amplifier to amplify the output of the light detector;

(e) providing a signal processing circuit to measure the output of the amplifier; and (f) providing a threshold detector to detect whether the output of the amplifier exceeds a threshold and provide an output signal if the output of the amplifier exceeds the threshold;

(g) providing a level meter to display the measurement of the output of the amplifier;

(h) providing an indicator to indicate whether the output of the amplifier exceeds the threshold of the threshold detector; and (i) providing a signal relay to relay the output signal of the threshold detector.

12. The method of claim 1, wherein the high voltage supply supplies an alternating current (AC) voltage and the opto-isolator further includes a second light source and a second light detector, the second light source having a negative current flowing through it, the method further comprising:

(d) electrically coupling the second light source to the emitter; and (e) measuring the output of the second light detector, the output of the second light detector being related to the negative current flowing through the second light source.

13. The method of claim 1, wherein the high voltage supply supplies an alternating current (AC) voltage and the opto-isolator further includes a second light source, the second light source having a negative current flowing through it, the method further comprising:

(d) electrically coupling the second light source to the emitter, wherein the output of the light detector is also related to the current flowing through the second light source.

14. A method of regulating current flow in an ionization device, the ionization device including (i) a high voltage output supply, and (ii) an emitter electrically coupled to the HV output supply, the method comprising:

(a) providing an opto-isolator including a light source and a light detector, the light source having a current flowing through it;

(b) connecting the light source to the emitter; and (c) adjusting the output of the HV output supply based upon the output of the light detector, thereby regulating the current flowing to the emitter, wherein the output of the light detector is related to the current flowing through the light source.

15. The method of claim 14, wherein the current flowing through the light source is the current flowing to the emitter.

16. The method of claim 14, wherein the current flowing through the light source is the current flowing from the HV supply.

17. The method of claim 14, wherein the light source is selected from the group comprising: an LED, a neon bulb, an incandescent bulb, and an electroluminescent element.

18. The method of claim 14, wherein the light detector is selected from the group comprising: a pin diode, a photo diode, a phototransistor, and a photocell.

19. The method of claim 14, further comprising:

(d) providing a voltage limiting circuit that limits the voltage across the light source.

20. The method of claim 14, wherein the light detector and the light source are spatially separated by an air gap.

21. The method of claim 14 wherein the light source outputs light, the method further comprising:

(d) transmitting the light output from the light source to the light detector through a fiber optic light pipe.

22. The method of claim 14, wherein the light detector and the light source are electrically isolated by a potting material.

23. The method of claim 14, wherein the ionization device further includes (iii) a second emitter electrically coupled to the HV supply, the method further comprising:

(d) providing a second opto-isolator, including a light source and a light detector, the light source having a current flowing through it;

(e) connecting the light source of the second opto-isolator to the second emitter; and (f) adjusting the output of the HV output supply based upon the output of at least one of the light detectors, thereby regulating the current flowing to the emitters, wherein the output of the at least one of the light detectors is related to the current flowing through at least one of the light sources.

24. The method of claim 14, further comprising:

(d) providing a signal amplifier to amplify the output of the light detector;

(e) providing a signal processing circuit to measure the output of the amplifier; and (f) providing a threshold detector to detect whether the output of the amplifier exceeds a threshold and provide an output signal if the output of the amplifier exceeds the threshold;

(g) providing a level meter to display the measurement of the output of the amplifier;

(h) providing an indicator to indicate whether the output of the amplifier exceeds the threshold of the threshold detector; and (i) providing a signal relay to relay the output signal of the threshold detector.

25. The method of claim 14, wherein the high voltage supply supplies an AC voltage and the opto-isolator further includes a second light source and a second light detector, the second light source having a negative current flowing through it, the method further comprising:

(d) electrically coupling the second light source to the emitter; and (e) adjusting the output of the HV output supply based upon the output of the second light detector, thereby regulating the current flowing to the emitter, wherein the output of the second light detector is related to the negative current flowing through the second light source.

26. The method of claim 14, wherein the high voltage supply supplies an AC voltage and the opto-isolator further includes a second light source, the second light source having a negative current flowing through it, the method further comprising:

(d) electrically coupling the second light source to the emitter, wherein the output of the light detector is also related to the current flowing through the second light source.

27. An apparatus for measuring current in an ionization device, the ionization device including (i) a high voltage supply, and (ii) an emitter electrically coupled to the HV supply, the apparatus comprising:

(a) an opto-isolator including a light source and a light detector, the light source being electrically coupled to the emitter and having a current flowing through it; and (b) circuitry that receives the output of the light detector and provides a measurement of current flowing through the light source, the output of the light detector being related to the current flowing through the light source.

28. The apparatus of claim 27, wherein the current flowing through the light source is the current flowing to the emitter.

29. The apparatus of claim 27, wherein the current flowing through the light source is the current flowing from the HV supply.

30. The apparatus of claim 27, wherein the light source is selected from the group comprising: an LED, a neon bulb, an incandescent bulb, and an electroluminescent element.

31. The apparatus of claim 27, wherein the light detector is selected from the group comprising: a pin diode, a photo diode, a phototransistor, and a photocell.

32. The apparatus of claim 27, further including:

(c) a voltage limiting circuit that limits the voltage across the light source.

33. The apparatus of claim 27, wherein the light detector and the light source are spatially separated by an air gap.

34. The apparatus of claim 27 wherein the light source outputs light, the apparatus further including:

(c) a light pipe that transmits the light output from the light source to the light detector through a fiber optic light pipe.

35. The apparatus of claim 27, wherein the light detector and the light source are electrically isolated by a potting material.

36. The apparatus of claim 27, wherein the ionization device further includes (iii) a second emitter electrically coupled to the HV supply, the apparatus further including:

(c) a second opto-isolator including a light source and a light detector, the light source being electrically coupled to the second emitter and having a current flowing through it; and (d) circuitry that receives the output of the light detector of the second opto-isolator and provides a measurement of current flowing through the light source of the second opto-isolator, the output of the light detector of the second opto-isolator being related to the current flowing through the light source of the second opto-isolator.

37. The apparatus of claim 27, further including:
(c) a signal amplifier to amplify the output of the light detector;
(d) a signal processing circuit to measure the output of the amplifier; and
(f) a threshold detector to detect whether the output of the amplifier exceeds a threshold and provide an output signal if the output of the amplifier exceeds the threshold;
(g) a level meter to display the measurement of the output of the amplifier;
(h) an indicator to indicate whether the output of the amplifier exceeds the threshold of the threshold detector; and
(i) a signal relay to relay the output signal of the threshold detector.

38. The apparatus of claim 27, wherein the high voltage supply supplies an AC voltage, the opto-isolator further including a second light source and a second light detector, the second light source being electrically coupled to the emitter and having a negative current flowing through it, the opto-isolator further including:
(c) circuitry that receives the output of the second light detector and provides a measurement of negative current flowing through the second light source, the output of the second light detector being related to the negative current flowing through the second light source.

39. The apparatus of claim 27, wherein the high voltage supply supplies an AC voltage, the opto-isolator further including a second light source, the second light source being electrically coupled to the emitter and having a negative current flowing through it,
wherein the output of the light detector is also related to the current flowing through the second light source.

40. An apparatus for regulating current flow in an ionization device, the ionization device including (i) a high voltage supply, and (ii) an emitter electrically coupled to the HV supply, the apparatus including:
(a) an opto-isolator including a light source and a light detector, the light source being electrically coupled to the emitter and having a current flowing through it; and
(b) circuitry that receives the output of the light detector and adjusts the output of the HV output supply based upon the output of the light detector, thereby regulating the current flowing to the emitter, wherein the output of the light detector is related to the current flowing through the light source.

41. The apparatus of claim 40, wherein the current flowing through the light source is the current flowing to the emitter.

42. The apparatus of claim 40, wherein the current flowing through the light source is the current flowing from the HV supply.

43. The apparatus of claim 40, wherein the light source is selected from the group comprising: an LED, a neon bulb, an incandescent bulb, and an electroluminescent element.

44. The apparatus of claim 40, wherein the light detector is selected from the group comprising: a pin diode, a photo diode, a phototransistor, and a photocell.

45. The apparatus of claim 40, further including:
(c) a voltage limiting circuit that limits the voltage across the light source.

46. The apparatus of claim 40, wherein the light detector and the light source are spatially separated by an air gap.

47. The apparatus of claim 40 wherein the light source outputs light, the apparatus further including:
(c) a light pipe that transmits the light output from the light source to the light detector through a fiber optic light pipe.

48. The apparatus of claim 40, wherein the light detector and the light source are electrically isolated by an potting material.

49. The apparatus of claim 40, wherein the ionization device further includes (iii) a second emitter electrically coupled to the HV supply, the apparatus further including:
(c) a second opto-isolator including a light source and a light detector, the light source being electrically coupled to the second emitter and having a current flowing through it; and
(d) circuitry that receives the output of at least one of the light detectors and adjusts the output of the HV output supply based upon the output of the at least one light detector, thereby regulating the current flowing to the emitters, wherein the output of the at least one light detector is related to the current flowing through at least one light source.

50. The apparatus of claim 40, further including:
(d) a signal amplifier to amplify the output of the light detector;
(e) a signal processing circuit to measure the output of the amplifier; and
(f) a threshold detector to detect whether the output of the amplifier exceeds a threshold and provide an output signal if the output of the amplifier exceeds the threshold;
(g) a level meter to display the measurement of the output of the amplifier;
(h) an indicator to indicate whether the output of the amplifier exceeds the threshold of the threshold detector; and
(i) a signal relay to relay the output signal of the threshold detector.

51. The apparatus of claim 40, wherein the high voltage supply supplies an AC voltage, the opto-isolator further including a second light source and a second light detector, the second light source being electrically coupled to the emitter and having a negative current flowing through it, the apparatus further comprising:
(c) circuitry that receives the output of the second light detector and adjusts the output of the HV output supply based upon the output of the second light detector, thereby regulating the current flowing to the emitter, wherein the output of the second light detector is related to the negative current flowing through the second light source.

52. The apparatus of claim 40, wherein the high voltage supply supplies an AC voltage, the opto-isolator further including a second light source, the second light source being electrically coupled to the emitter and having a negative current flowing through it,
wherein the output of the light detector is also related to the current flowing through the second light source.

* * * * *